(12) United States Patent
Laven et al.

(10) Patent No.: US 9,419,080 B2
(45) Date of Patent: Aug. 16, 2016

(54) SEMICONDUCTOR DEVICE WITH RECOMBINATION REGION

(71) Applicant: Infineon Technologies AG, Neubiberg (DE)

(72) Inventors: Johannes Georg Laven, Taufkirchen (DE); Hans-Joachim Schulze, Taufkirchen (DE); Peter Irsigler, Obernberg am Inn (AT); Holger Huesken, Munich (DE); Roman Baburske, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 76 days.

(21) Appl. No.: 14/102,883

(22) Filed: Dec. 11, 2013

(65) Prior Publication Data

US 2015/0162406 A1 Jun. 11, 2015

(51) Int. Cl.
| | |
|---|---|
| H01L 29/06 | (2006.01) |
| H01L 29/10 | (2006.01) |
| H01L 29/739 | (2006.01) |
| H01L 29/78 | (2006.01) |
| H01L 29/861 | (2006.01) |

(52) U.S. Cl.
CPC ........ *H01L 29/1095* (2013.01); *H01L 29/0696* (2013.01); *H01L 29/7397* (2013.01); *H01L 29/7813* (2013.01); *H01L 29/861* (2013.01)

(58) Field of Classification Search
USPC ........................................................ 257/335
See application file for complete search history.

(56) References Cited

U.S. PATENT DOCUMENTS

| 8,476,712 B2 | 7/2013 | Baburske et al. |
| 2002/0093049 A1 | 7/2002 | Tihanyi et al. |
| 2002/0179976 A1 | 12/2002 | Takahashi |
| 2013/0320487 A1 | 12/2013 | Mauder et al. |
| 2013/0341674 A1* | 12/2013 | Werber .................. H01L 29/32 257/140 |
| 2014/0015007 A1* | 1/2014 | Werber ............... H01L 29/0615 257/142 |
| 2014/0021590 A1 | 1/2014 | Schulze et al. |
| 2014/0197876 A1 | 7/2014 | Laven et al. |
| 2014/0209973 A1 | 7/2014 | Laven et al. |
| 2015/0014743 A1 | 1/2015 | Werber et al. |
| 2015/0015309 A1 | 1/2015 | Werber |
| 2015/0041962 A1 | 2/2015 | Laven et al. |
| 2015/0076554 A1 | 3/2015 | Laven et al. |
| 2015/0091051 A1 | 4/2015 | Laven et al. |
| 2015/0091052 A1 | 4/2015 | Laven et al. |
| 2015/0115316 A1 | 4/2015 | Oyama et al. |
| 2015/0144988 A1 | 5/2015 | Laven et al. |
| 2015/0145028 A1 | 5/2015 | Laven et al. |
| 2015/0162406 A1 | 6/2015 | Laven et al. |
| 2015/0162407 A1 | 6/2015 | Laven et al. |

OTHER PUBLICATIONS

Laven, J.G., et al., "Semiconductor Device and Method for Forming a Semiconductor Device." U.S. Appl. No. 14/040,867, filed Sep. 30, 2013.

(Continued)

*Primary Examiner* — Thao P Le
(74) *Attorney, Agent, or Firm* — Murphy, Bilak & Homiller, PLLC

(57) ABSTRACT

A semiconductor device includes a pn junction between a drift zone and a charge-carrier transfer region in a semiconductor body. An access channel provides a permanent charge carrier path connecting the drift zone with a recombination region through a separation region between the drift zone and the recombination region. The access channel adjusts a plasma density in the drift zone and the recombination region.

20 Claims, 15 Drawing Sheets

(56) References Cited

OTHER PUBLICATIONS

Laven, J.G., et al., "Semiconductor Device and Method for Forming a Semiconductor Device." U.S. Appl. No. 14/040,891, filed Sep. 30, 2013.

Werber, et al. "Semiconductor Device with Charge Carrier Lifetime Reduction Means." U.S. Appl. No. 13/923,436, filed Jun. 21, 2013.

Werber, et al. "Reverse Conducting IGBT." U.S. Appl. No. 13/529,185, filed Jun. 21, 2012.

\* cited by examiner

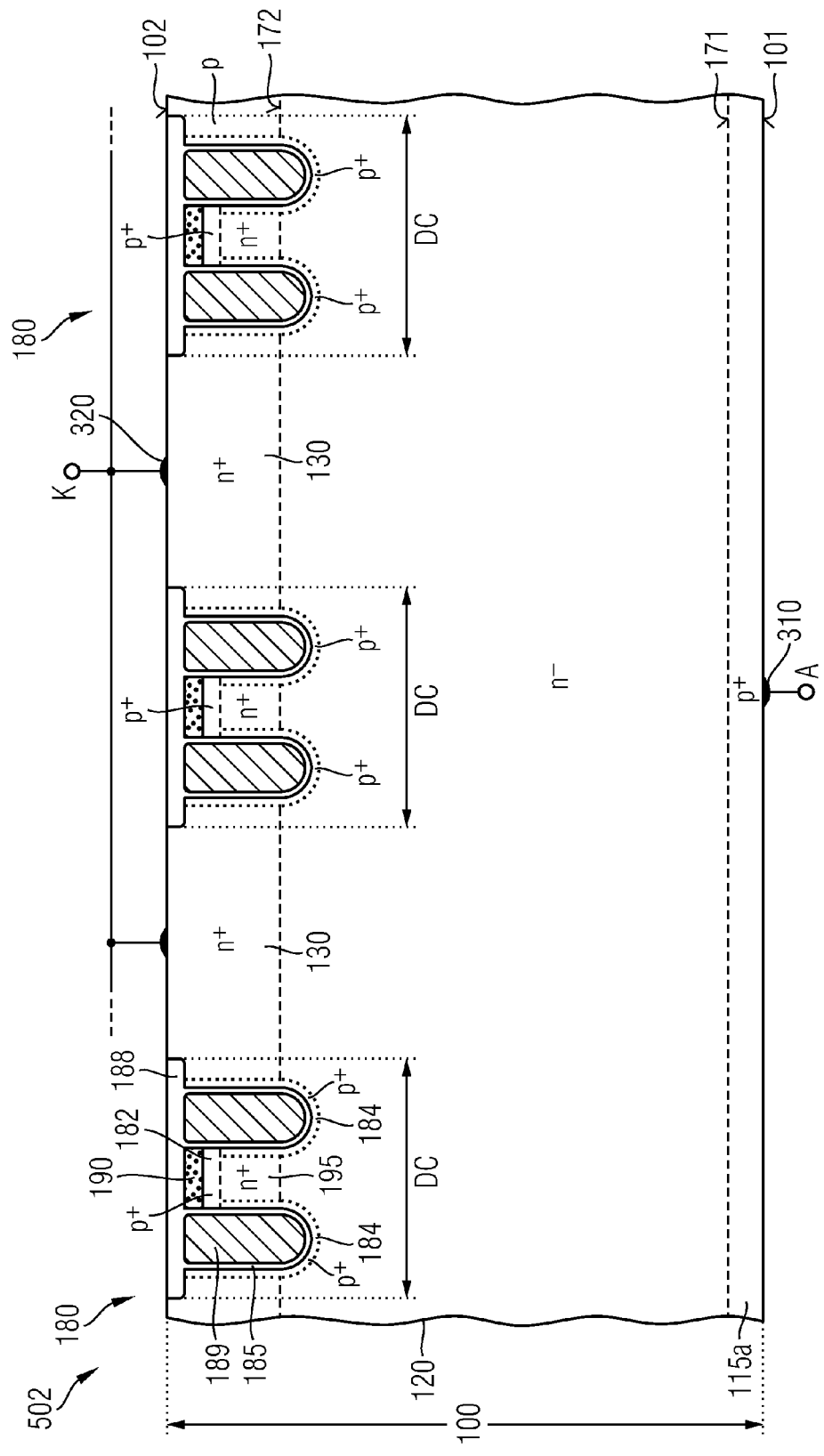

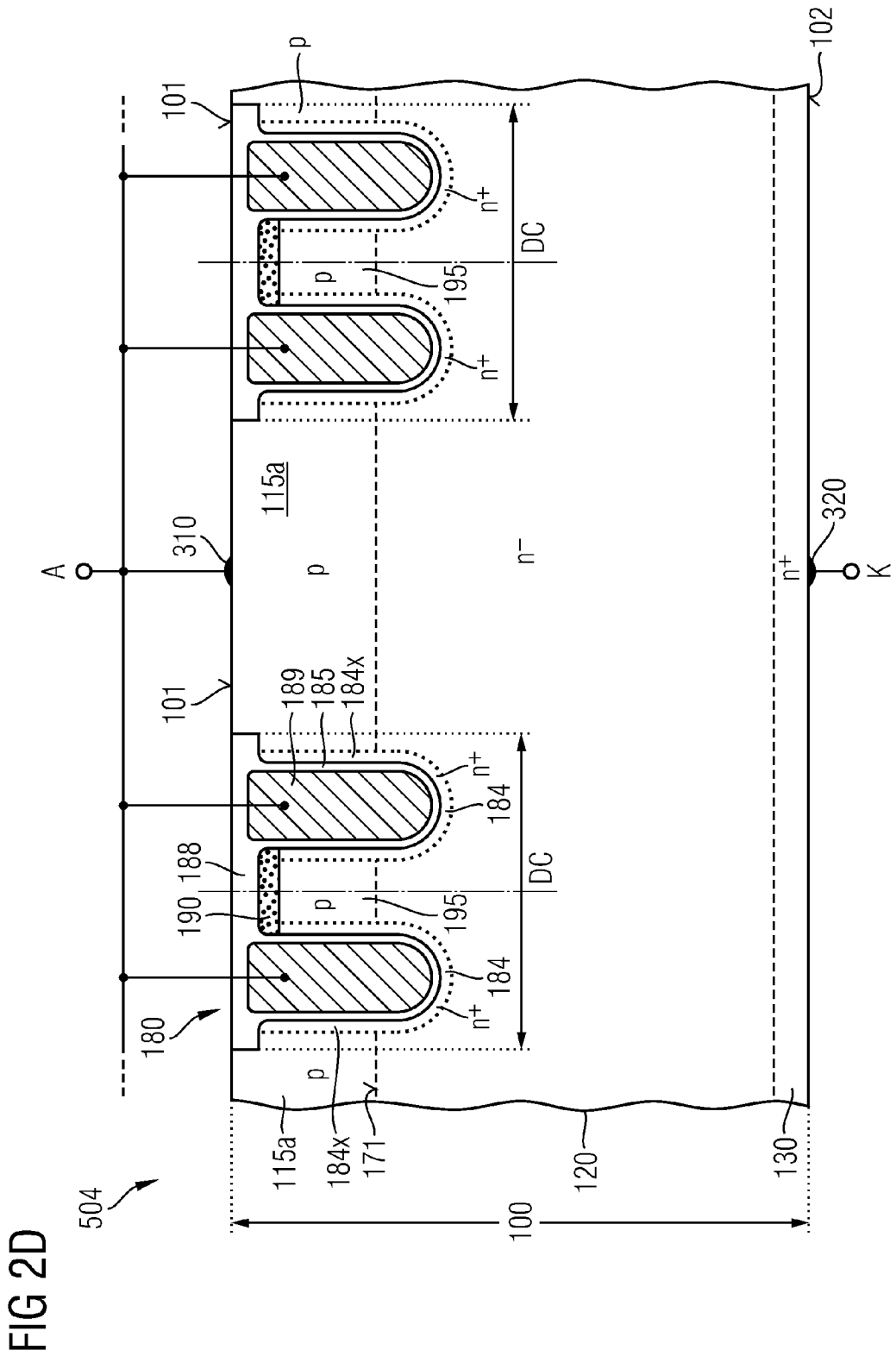

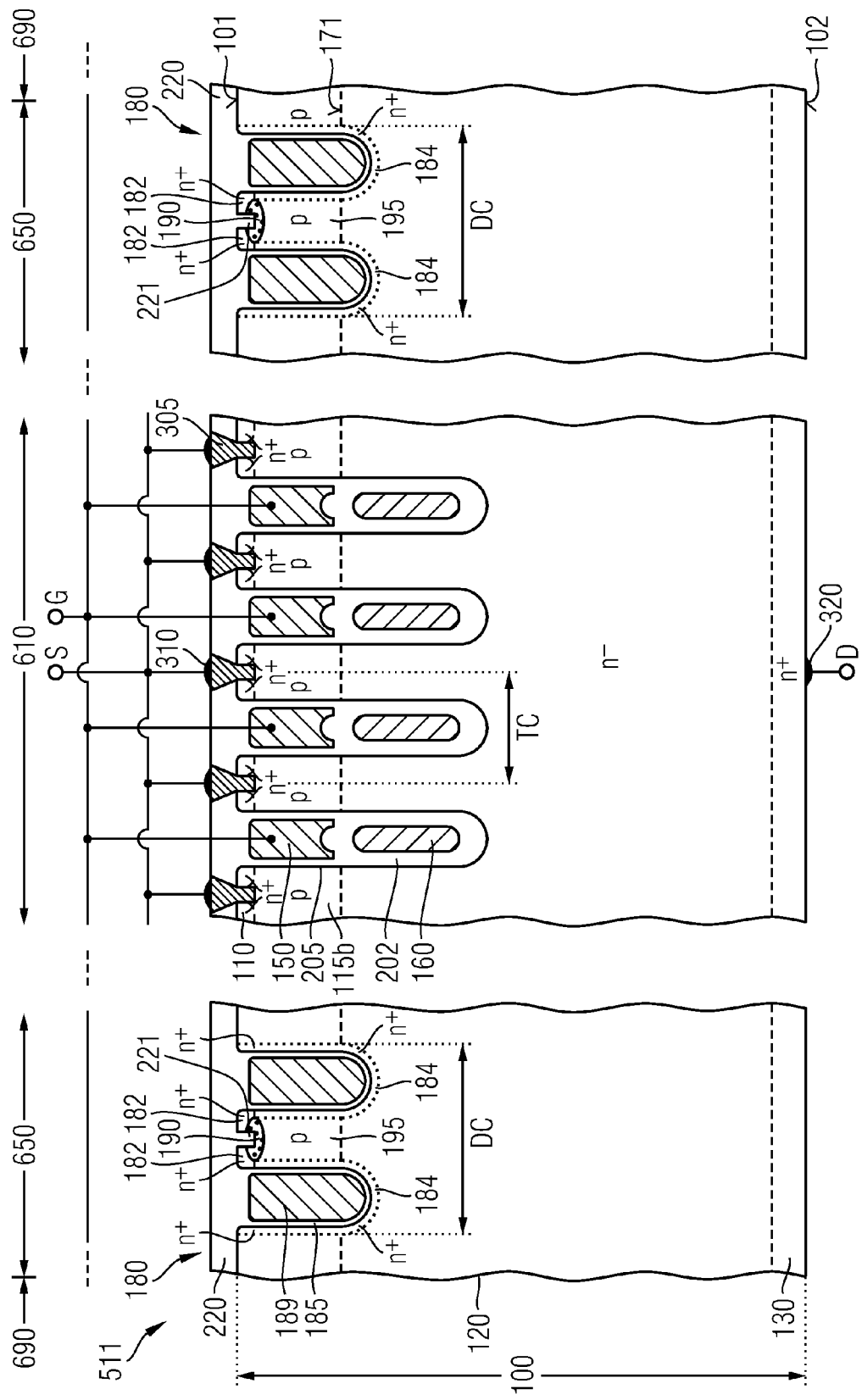

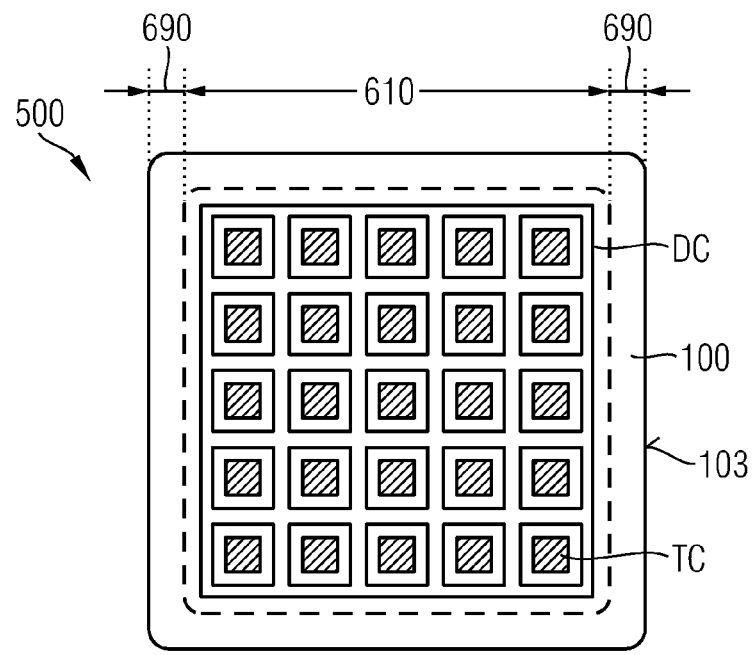
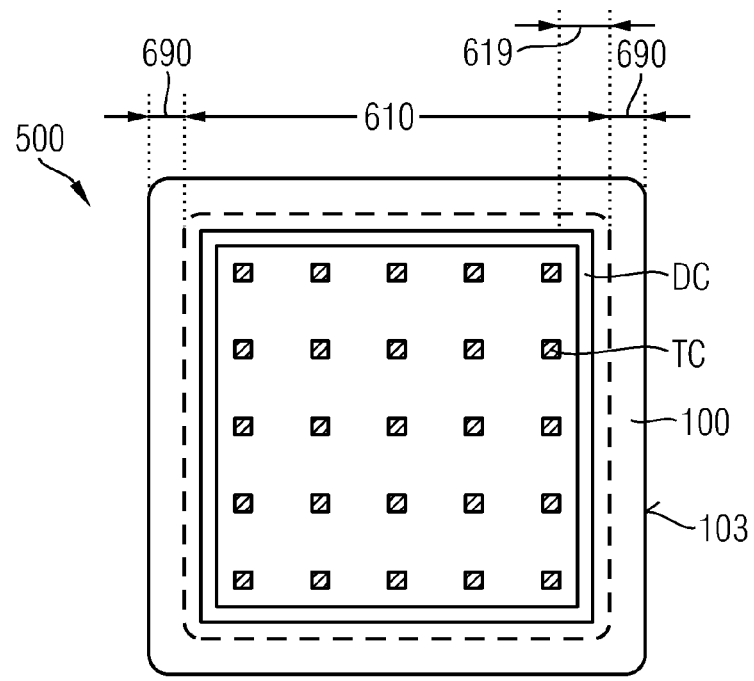

US 9,419,080 B2

SEMICONDUCTOR DEVICE WITH RECOMBINATION REGION

BACKGROUND

At a forward biased pn junction of semiconductor devices like semiconductor diodes, IGFETs (insulated gate field effect transistors) and IGBTs (insulated gate bipolar transistors) mobile charge carriers flood the semiconductor regions on both sides of the pn junction. Where at least one of these regions is formed as a drift zone with comparatively low impurity concentration and comparatively large extension along a current flow direction, the charge carriers form a charge carrier plasma. A reverse recovery current removes the charge carrier plasma from the drift zone when the pn junction switches from forward biased to reverse biased. The reverse recovery current contributes to the dynamic switching losses of the semiconductor device. It is desirable to provide semiconductor devices with improved device characteristics.

SUMMARY

An embodiment refers to a semiconductor device including a pn junction between a drift zone and a charge-carrier transfer region in a semiconductor body. An access channel provides a permanent charge carrier path connecting the drift zone with a recombination region through a separation region between the drift zone and the recombination region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2B is a schematic cross-sectional view of a portion of a semiconductor device in accordance with an embodiment related to a semiconductor diode with desaturation cells at a rear side.

FIG. 2D is a schematic cross-sectional view of a portion of a semiconductor device in accordance with an embodiment related to a semiconductor diode with desaturation cells comprising electrically connected fill portions.

FIG. 3A is a schematic cross-sectional view of a portion of a semiconductor device in accordance with an embodiment related to an IGFET.

FIG. 5C is a schematic plan view of a semiconductor body of a semiconductor device including a grid-shaped desaturation cell and transistor cells formed in the meshes of the desaturation cell.

FIG. 5D is a schematic plan view of a semiconductor body of a semiconductor device including a frame-like desaturation cell and evenly distributed compact transistor cells.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
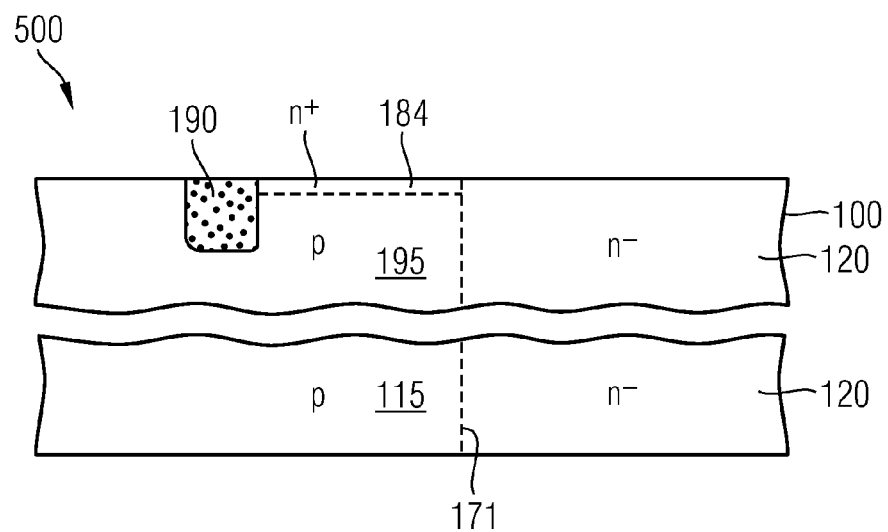
FIG. 1A is a schematic cross-sectional view of a portion of a semiconductor device with a pn junction for illustrating aspects of the embodiments.

FIG. 1A shows a portion of a semiconductor device 500 which may be semiconductor diode, an IGFET, for example an MOSFET (metal oxide semiconductor field effect transistor) in the usual meaning including FETs (field effect transistors) with metal gates and FETs with non-metal gates, or an IGBT, for example an RB-IGBT (reverse blocking IGBT) or an RC-IGBT (reverse conducting IGBT). A semiconductor body 100 of the semiconductor device 500 is provided from a single-crystalline semiconductor material, for example silicon (Si), silicon carbide (SiC), germanium (Ge), a silicon germanium crystal (SiGe), gallium nitride (GaN) or gallium arsenide (GaAs), by way of example.

A pn junction 171 is formed in the semiconductor body 100 between a charge-carrier transfer region 115 and a drift zone 120, where the charge-carrier transfer region 115 has a first conductivity type and the drift zone 120 a first conductivity type, which is the opposite of the second conductivity type. In the illustrated embodiments, the first conductivity type is n-type and the second conductivity type is p-type. According to other embodiments, the first conductivity type may be p-type and the second conductivity type n-type.

The charge-carrier transfer region 115 may be an anode region of a semiconductor diode or a body region of an IGFET cell of an IGFET or an IGFET cell that controls a current flow through an IGBT.

An impurity concentration in the drift zone 120 may be lower than an impurity concentration in the charge-carrier transfer region 115 such that when the pn junction 171 is reverse-biased a depletion region predominantly extends from the pn junction 171 into the drift zone 120. According to an embodiment, a mean impurity concentration in the charge-carrier transfer region 115 is at least ten times as high as the impurity concentration in the drift zone 120. By way of example, the impurity concentration in the drift zone 120 may be at most $1 \times 10^{15}$ (1E15) $cm^{-3}$, for example at most $1 \times 10^{14}$ (1E14) $cm^{-3}$.

The semiconductor device 500 further includes a recombination region 190 at a distance to the pn junction 171. At a surface or even below the surface of the recombination region 190, a recombination rate (recombination velocity) is higher than the recombination rate at typical semiconductor-to-insulator interfaces. For example, the recombination velocity at a perfect silicon-to-siliconoxide interface is in the range of 30 to 100 cm/s. At a higher density of traps at the silicon-to-siliconoxide interface, the recombination velocity may reach values up to at most $10^4$ cm/s. Instead, according to an embodiment, the surface recombination rate or surface recombination velocity of the recombination region 190 is at least 0.5% of the saturation velocity of charge carriers in the semiconductor body 100. In case the semiconductor body 100 is based on silicon, the surface recombination velocity may be at least $5 \times 10^4$ (5E04) cm/s, for example greater than $1 \times 10^5$ (1E05) cm/s or at least $1 \times 10^6$ (1E06) cm/s.

The recombination region 190 may consist of or contain a metal or a metal compound, for example a conductive metal silicide like $CoSi_2$, $HfSi_2$, $MoSi_2$, $NiSi_2$, $PdSi_2$, $PtSi$, $TaSi_2$, $TiSi_2$, $WSi_2$, or $ZrSi_2$ and may have a high temperature stability such that the recombination region 190 can be provided at an early stage of the manufacturing process. According to other embodiments, the recombination region 190 may consist of or contain aluminum, for example Al, AlSi, or AlSiCu, which can be deposited and etched in an economic way.

In accordance with further embodiments, the recombination region 190 is distorted mono-crystalline semiconductor material provided, for example, by depositing amorphous, mono-crystalline, micro-crystalline or polycrystalline semiconductor material or by implanting impurities into the semiconductor body 100 at high implant doses and/or implant energy, wherein the subsequent manufacturing processes are controlled to secure that the damaged crystal maintains the desired recombination characteristics in the finalized semiconductor device 500.

The recombination region 190 may or may not be dielectrically insulated from conductive structures electrically connected to load terminals of the semiconductor device 500. According to an embodiment, the recombination region 190 may float.

A separation region 195 spatially separates the recombination region 190 from the drift zone 120 in the semiconductor body 100. The separation region 195 may form a homojunction or a heterojunction with the drift zone 120. According to an embodiment the separation region 195 and the drift zone 120 have complementary conductivity types. According to another embodiment the separation region 195 and the drift zone 120 have the same conductivity type, wherein the mean net impurity concentration in the separation region 195 may be at least as high as the impurity concentration in the drift zone 120. According to an embodiment, the mean net impurity concentration in the separation region 195 is at least twice, e.g., at least ten times as high as the mean impurity concentration in the drift zone 120. The impurity concentration in the separation region 195 may be in the range of or the same as in the charge carrier transfer region 115.

A permanent access channel 184 structurally connects the recombination region 190 with the drift zone 120 through the separation region 195 and provides a highly conductive path for minority charge carriers in the separation region 195. For example, for a p-type separation region 195 the access channel 184 provides a conductive channel for electrons and for an n-type separation region 195 the access channel 184 provides a conductive path for holes.

The permanent access channel 184 may be a doped channel containing stationary impurities of a type allowing a current flow of the respective charge carriers. For example, an n-type access channel 184 for a p-type separation region 195 may contain donor atoms. A p-type access channel 184 for an n-type separation region 195 may contain acceptor atoms. The donor or acceptor atoms may overcompensate a background impurity concentration of the conductivity type of the separation region 195.

In accordance with further embodiments, the permanent access channel 184 may have the same conductivity type as the separation region 195 as regards the stationary impurity atoms and an adjoining field structure contains stationary charge carriers whose electric field locally accumulates mobile minority charge carriers of the separation region 195 in an inversion channel along an interface with the field structure, wherein the inversion channel provides a conductive path for the respective charge carrier type. For example, positive stationary charge carriers in the adjoining field structure may accumulate electrons in an inversion channel adjoining the parting structure 180 and providing a path for electrons in a p-type separation region 195. Negative stationary charge carriers in the adjoining field structure may accumulate holes in an inversion channel adjoining the field structure and providing a path for holes in an n-type separation region 195 adjoining the field structure. In each case, the respective inversion channel forms the access channel 184 providing a permanent conductive path for one type of charge carriers between the drift zone 120 and the recombination region 190.

When the pn junction 171 is forward biased, the charge-carrier transfer region 115 injects p-type charge carriers (holes) into the drift zone 120 and n-type charge carriers (electrons) are injected into the drift zone 120 from an opposite side. The injected charge carriers form a charge carrier plasma in the drift zone 120 that ensures a low forward resistance in case of semiconductor diodes or a low on-state resistance in case of semiconductor switching devices like IGFETs or IGBTs. When the pn junction 171 switches from forward biased to reverse biased, a reverse recovery current removes the charge carrier plasma, wherein the resulting reverse recovery losses contribute to the switching losses of the semiconductor device 500.

By connecting the drift zone 120 with the recombination region 190 the access channel 184 reduces the charge carrier plasma density in the drift zone 120. When the pn junction 171 is forward biased, the separation region 195 and the charge carrier transfer region 115 are effective as potential barriers for electrons in the charge carrier plasma such that the efficiency of the recombination region 190 is predominantly subject to the characteristics of the access channel 184. The potential barrier may be comparatively high to minimize the influence of the recombination region 190 on the characteristics of the semiconductor device 500 for the forward biased pn junction 171. The separation region 195 may be doped sufficiently high such that the effective recombination rate at the recombination region 190 is limited only by the minority charge carrier current through the access channel 184.

Figure 1B:
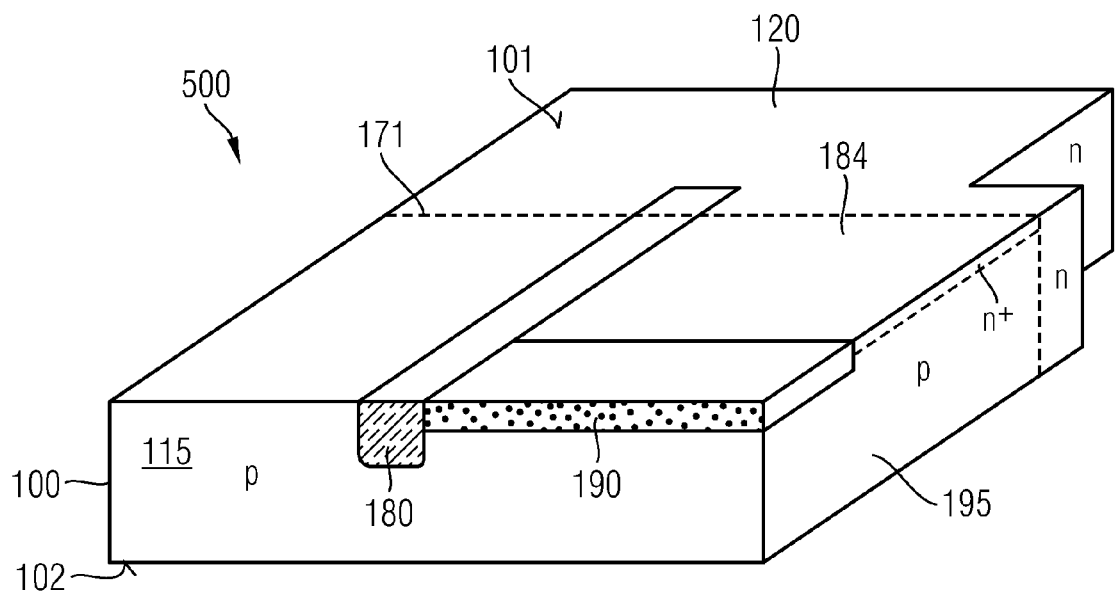
FIG. 1B is a schematic cross-sectional view of a portion of a semiconductor device according to an embodiment related to a vertical pn junction.

FIG. 1B refers to lateral devices with the pn junction 171 extending in a plane perpendicular to a first surface 101 of the semiconductor body 100. The charge-carrier transfer region 115, the drift zone 120, and the separation region 195 may directly adjoin the first surface 101. A parting structure 180, e.g., shallow trench insulation may separate the charge-carrier transfer region 115 from the separation region 195. An n-type access channel 184 may be formed at the first surface 101 of the semiconductor body 100 in the vertical projection of the separation region 195 between the pn junction 171 and the recombination region 190.

Figure 1C:
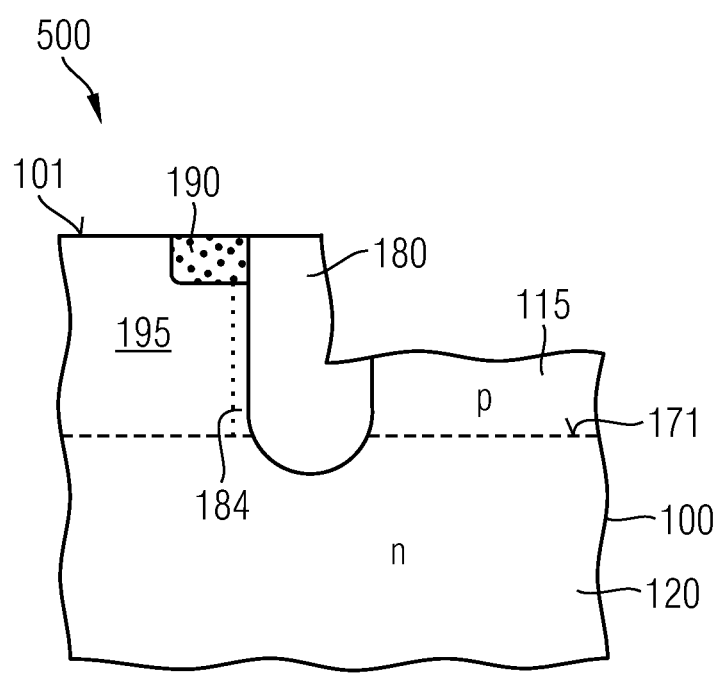
FIG. 1C is a schematic cross-sectional view of a portion of a semiconductor device according to an embodiment related to a horizontal pn junction.

FIG. 1C refers to vertical devices with the pn junction 171 formed in a plane parallel to a first surface 101 of a semiconductor body 100. The charge-carrier transfer region 115 as well as the separation region 195 may be formed between the first surface 101 and the pn junction 171. A parting structure 180 may extend from the first surface 101 down to at least the pn junction 171. The recombination region 190 may directly adjoin the parting structure 180. The parting structure 180 may contain stationary charge carriers inducing an access channel 184 of minority charge carriers in the separation region 195 along the interface with the parting structure 180.

Alternatively or in addition, the access channel 184 may contain stationary impurities of a conductivity type opposite to the conductivity type of the separation region 195. The dopant and/or acceptor atoms may be introduced by, e.g., plasma deposition, ion beam implantation at implant angles tilted to the normal by more than 3.5 degree, epitaxial growth or outdiffusion from a solid phase after forming and before filling trenches for the parting structures 180.

Figure 2A:
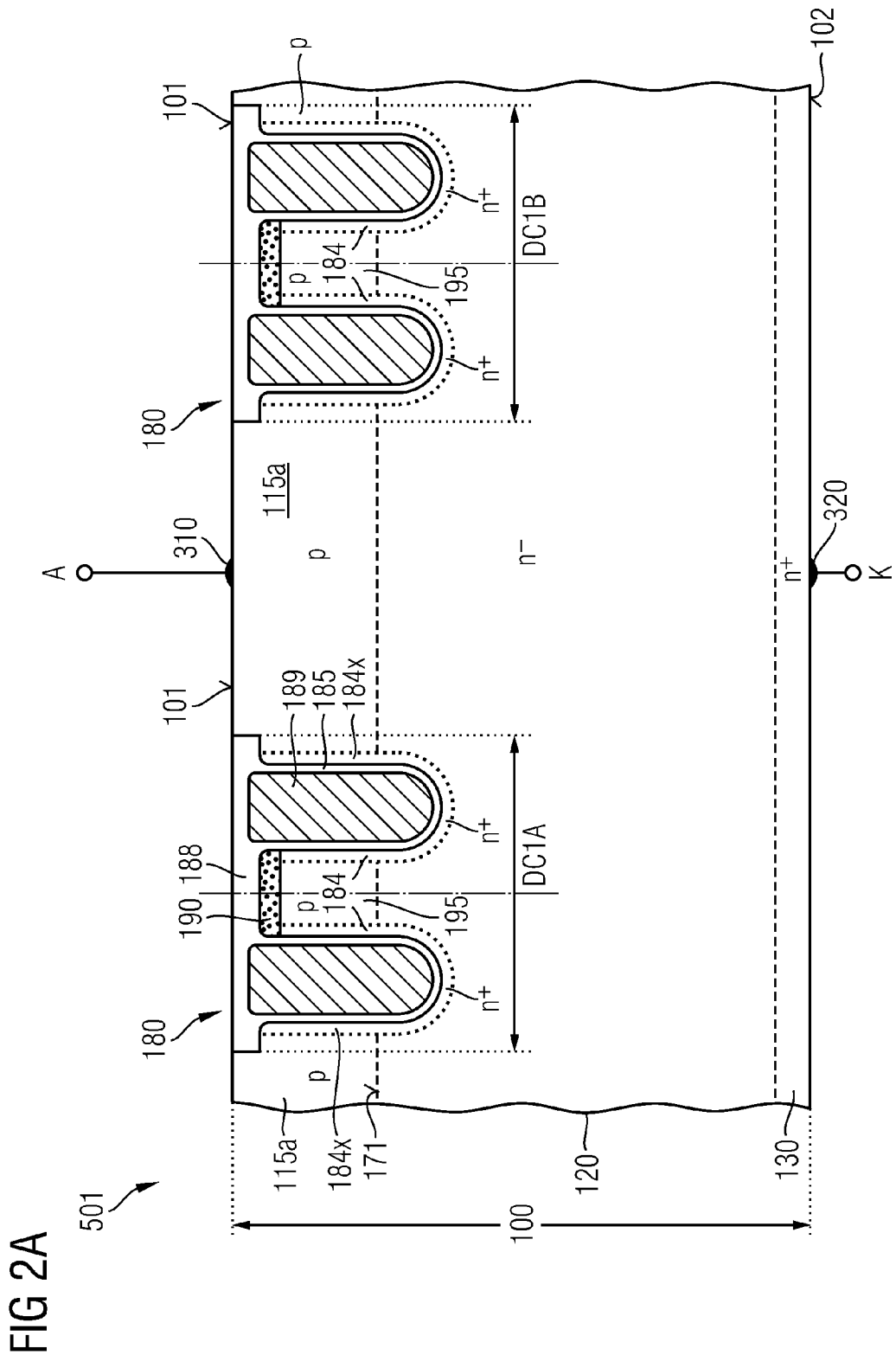
FIG. 2A is a schematic cross-sectional view of a portion of a semiconductor device in accordance with an embodiment related to a semiconductor diode with desaturation cells at a front side.

The semiconductor device illustrated in FIG. 2A is a vertical semiconductor diode 501 with a drift zone 120 of the first conductivity type and an anode region 115a of the second conductivity type. The anode region 115a may be effective as the charge-carrier transfer region 115 of FIGS. 1A to 1C. The anode region 115a and the drift zone 120 form a pn junction 171 parallel to a first surface 101 of a semiconductor body 100. A normal to the first surface 101 defines a vertical direction and directions parallel to the first surface 101 are lateral directions.

A heavily doped pedestal layer 130 of the first conductivity type is formed between the drift zone 120 and a second surface 102 opposite to the first surface 101. A mean impurity concentration in the drift zone 120 may be between $1\times10^{12}$ (1E12) cm$^{-3}$ and $1\times10^{15}$ (1E15) cm$^{-3}$, by way of example. The impurity concentration in the pedestal layer 130 may be at least $5\times10^{17}$ (5E17) cm$^{-3}$, by way of example. A distance between the first and second surfaces 101, 102 is subject to a nominal breakdown voltage the semiconductor diode 501 is specified for and may be greater than 45 μm, for example at least 90 μm. As regards the material of the semiconductor body 100, reference is made to the description of the semiconductor device 500 of FIG. 1A.

A first load electrode 310 is arranged at the side of the first surface 101 and directly adjoins the first surface 101 and the anode region 115a. The first load electrode 310 may form or may be electrically connected or coupled to an anode terminal A of the semiconductor diode 501. A second load electrode 320 directly adjoins the second surface 102 and the pedestal layer 130. The second load electrode 320 may form or may be electrically connected or coupled to a cathode terminal K.

Each of the first and second load electrodes 310, 320 may consist of or contain, as main constituent(s) aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), silver (Ag), gold (Au), platinum (Pt), and/or palladium (Pd). For example, at least one of the first and second load electrodes 310, 320 may include two or more sub-layers, wherein each sub-layer contains one or more of Ni, Ti, Ag, Au, Pt, W, and Pd as main constituent(s), e.g. a silicide, a nitride and/or an alloy.

The semiconductor diode 501 may include one or more desaturation cells DC1A, DC1B that may extend from the first surface 101 into the semiconductor body 100 down to at least the pn junction 171.

Each desaturation cell DC1A, DC1B includes a recombination region 190 buried in the semiconductor body 100 and arranged at a distance to the pn junction 171. A separation region 195 that separates the recombination region 190 from the pn junction 171 may have the same impurity concentration as the anode region 115a.

A cell insulator 188 may dielectrically insulate the recombination region 190 from the first load electrode 310. The cell insulator 188 may be between the first surface 101 and the recombination region 190 or at least in parts above the first surface 101. A parting structure 180 extending from the first surface 101 into the semiconductor body 100 down to at least the pn junction 171 may include a fill portion 189 and an insulator portion 185 insulating the fill portion 189 from the surrounding material of the semiconductor body 100.

The insulator portion 185 may include one or more sublayers of dielectric materials such as silicon oxide, silicon oxynitride, or silicon nitride. The fill portion 189 may include one or more dielectric, intrinsic semiconducting or conductive materials, e.g., doped polycrystalline silicon. Conductive fill portions 189 of the desaturation cells DC1A, DC1B may float or may be electrically connected to each other.

According to an embodiment, the desaturation cells DC1A, DC1B may be rotational symmetric with respect to a vertical symmetry axis. For example, the lateral cross-sectional areas of the desaturation cells DC1A, DC1B may be polygons, for example hexagons or squares with or without rounded corners, or circles, wherein the fill portion 189 may surround the recombination region 190 in all lateral directions. According to other embodiments, the desaturation cells DC1A, DC1B are stripes extending in a lateral direction through an active area of the semiconductor diode 501, wherein a pair of parting structures 180 extends on opposing sides of the stripe-shaped recombination region 190.

The desaturation cells DC1A, DC1B include permanent access channels 184 structurally connecting the recombination regions 190 with the drift zone 120 through the separation regions 195 and providing highly conductive paths for minority charge carriers in the separation region 195. The access channels 184 may directly adjoin the recombination regions 190. According to other embodiments, heavily doped connection regions of the first conductivity type may structurally connect the access channels 184 with the recombination region 190, respectively.

In the forward biased mode of the pn junction 171, a positive voltage is applied to the anode terminal A and a negative voltage is applied to the cathode terminal K. The first load electrode 310 injects holes into the anode region 115a and through the forward biased pn junction 171 into the drift zone 120. The second load electrode 320 injects electrons through the pedestal layer 130 into the drift zone 120. The resulting high-density charge carrier plasma in the drift zone 120 ensures a low forward resistance of the semiconductor diode 501.

The access channel 184 along the parting structure 180 from the drift zone 120 to the respective recombination region 190 forms a conductive path for electrons between the recombination region 190 and the drift zone 120. The high surface recombination rate at the recombination region 190 reduces the charge carrier lifetime of the electrons. As a consequence, the access channels 184 reduce the number of electrons in the drift zone 120 and control the charge carrier plasma density.

When the semiconductor diode 501 switches from forward biased to reverse biased the reverse recovery charge is lower than without the desaturation cells DC1A, DC1B. The semiconductor diode 501 reaches the blocking state faster and at a lower reverse recovery current. Since the recombination region 190 is permanently insulated from the first load electrode 310, the desaturation cells DC1A, DC1B can sustain a high blocking voltage and no short-circuit condition occurs during transition to the blocking mode.

A charge flow through the access channels 184 of the desaturation cells DC1A, DC1B may saturate at a forward current through the drift zone 120 below, at or beyond a maximum pulsed load current specified in the datasheet of the concerned device for repetitively pulsed, e.g., for periodic load currents as appearing, e.g., in rectifier or half-bridge applications, such that the relative desaturation efficiency can be tailored for different application requirements. For semiconductor diodes the maximum pulsed load current may be the maximum diode pulsed current $I_{FPuls}$ or the maximum average on-state current $I_{FAVM}$. Up to the saturation, the number of charge carriers flowing through the concerned access channel 184 depends on the charge carrier plasma density and increases with the forward or on-state current. Beyond saturation the electron current through the access channel 184 varies only little.

If the charge flow through the access channel 184 saturates below the maximum pulsed load current, the relative desaturation efficiency is low for high currents and the access channel 184 allows a comparatively high charge carrier plasma density at forward or on-state currents close to the maximum pulsed load current. In the same desaturation cell the relative desaturation efficiency grows with decreasing forward current during switching off such that the desaturation efficiency is high in a transition phase between the forward and blocking states.

If the charge flow through the access channel 184 saturates at or beyond the maximum pulsed load current but below an allowed over-current, e.g., the allowed surge current the relative desaturation efficiency remains high for operation up to the maximum rating resulting in low switching losses over the complete operation range. At the same time the resulting high charge carrier density for over-currents provides high surge current ruggedness.

According to another embodiment the semiconductor diode 501 includes first desaturation cells DC1A with a desaturation current below the maximum pulsed load current for reducing switching losses and second desaturation cells DC1B with a desaturation current beyond the maximum pulsed load current for improving surge current ruggedness.

According to a further embodiment, the semiconductor diode includes desaturation cells whose n-type access channels contain deep level donors like selenium (Se) or sulfur (S) atoms. Deep level donors are effective as donors only at and above a certain minimum temperature. Desaturation cells containing Se and/or S atoms start reducing the charge carrier plasma density only at temperatures indicating a local high temperature condition, e.g. hot spot events caused by current filaments occurring during a dynamic avalanche in the semiconductor diode 501. Desaturation cells containing S and/or Se may locally counteract hot spot events.

The semiconductor diode 501 may include different types of desaturation cells based on different impurity types.

The access channel 184 may be formed exclusively at a side of the parting structure 180 facing the recombination region 190 or may include further portions along the parting structure 180, wherein the cell insulator 188 may include a section that blocks an idle portion 184x of the access channel 184 extending along an outer edge of the parting structure 180 averted from the recombination region 190 such that the idle portion 184x does not adversely affect the device parameters. Alternatively or in addition a heavily doped channel stopper region of the second conductivity type may extend from the first surface 101 into the anode region 115a along the outer edge of the parting structure 180.

Alternatively or in addition, an outer section of the insulator portion 185 averted from the recombination region 190 may be thicker than an inner section facing the recombination region 190.

The absence of any control structure or any electric contact for switching a potential of conductive fill portions 189 of the parting structure 180 significantly reduces manufacturing complexity and facilitates implementation of desaturation cells DC even at a rear side of the semiconductor body 100 opposite to the first surface 101 as illustrated in FIG. 2B.

The semiconductor diode 502 of FIG. 2B includes desaturation cells DC formed on the cathode side or rear side of the device.

Parting structures 180 of desaturation cells DC extend from a second surface 102, which is oriented towards a cathode electrode, into a semiconductor body 100 down to at least a homojunction 172 between a drift zone 120 and a pedestal layer 130 and may include a fill portion 189 as well as an insulator portion 185 insulating the fill portion 189 from the surrounding material of the semiconductor body 100. The fill portion 189 may be insulated from the second load electrode 320 or may be electrically connected with the second load electrode 320. Separation regions 195 of the conductivity type of the drift zone 120 separate recombination regions 190 from the drift zone 120. As regards further details reference is made to the description of FIG. 2A.

For the minority charge carriers in the separation region 195 permanent access channels 184 structurally connect the drift zone 120 with the recombination regions 190 through the separation region 195 directly or through heavily doped connection regions of the second conductivity type. The access channels 184 provide highly conductive paths for holes through the n-type separation regions 195.

The p-type access channels 184 may contain stationary acceptor atoms which may overcompensate an n-type background impurity concentration defining the separation regions 195.

In accordance with further embodiments, the permanent access channel 184 may have the same conductivity type as the separation region 195 as regards the stationary impurity atoms and the parting structures 180 may contain negative stationary charge carriers accumulating holes in an inversion channel of an n-type separation region adjoining the parting structure 180. The access channels 184 form permanent conductive paths for holes between the drift zones 120 and the recombination regions 190.

Since for low-ohmic metal-to-semiconductor contacts an impurity concentration in an n-type semiconductor portion is higher than an impurity concentration in a p-type semiconductor portion, the cathode emitter efficiency is typically higher than the anode efficiency. As a result, the desaturation cells DC on the cathode side are highly efficient. Alternative techniques for reducing carrier lifetime at the expense of increased leakage current may be omitted, e.g., diffusing platinum (Pt) atoms into the semiconductor body 100

A semiconductor diode 503 illustrated in FIG. 2C combines desaturation cells DC1 on a front side as described with reference to FIG. 2A and desaturation cells DC2 on a rear side as described with reference to FIG. 2B. The desaturation cells DC1 on the front side may differ in size, population density and/or internal configuration from the desaturation cells DC2 on the rear side.

Other than the parting structure 180 of the semiconductor diode 501 of FIG. 2A parting structure 180 of desaturation cells DC in a semiconductor diode 504 illustrated in FIG. 2D include a conductive fill portion 189, e.g., from a heavily doped polycrystalline silicon material that may be electrically connected to the first load electrode 310, which is effective as the anode electrode such that parting structures 180 may be effective as compensation structures.

Figure 2C:
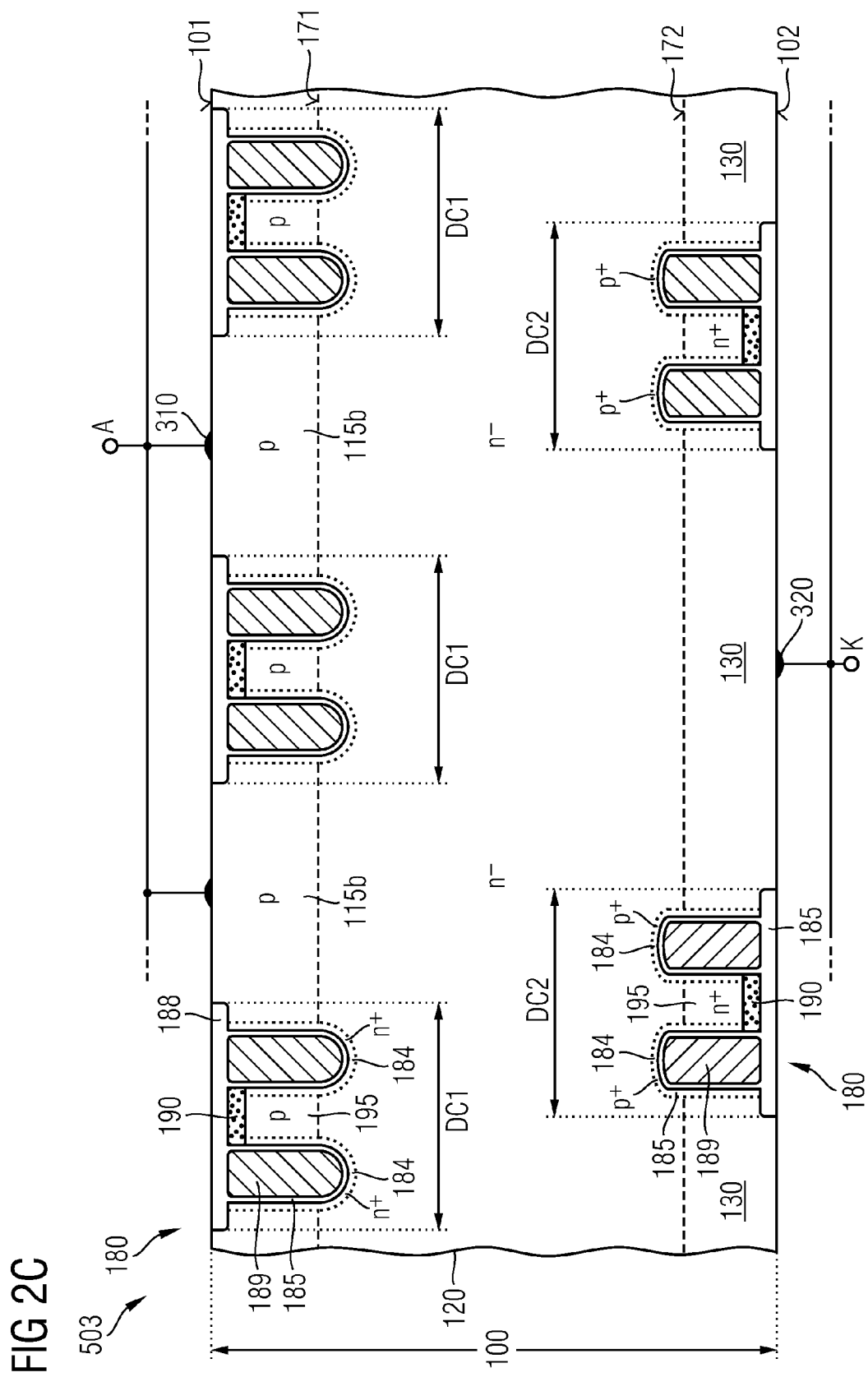
FIG. 2C is a schematic cross-sectional view of a portion of a semiconductor device in accordance with an embodiment related to a semiconductor diode with desaturation cells at both a front side and a rear side.
Figure 2E:
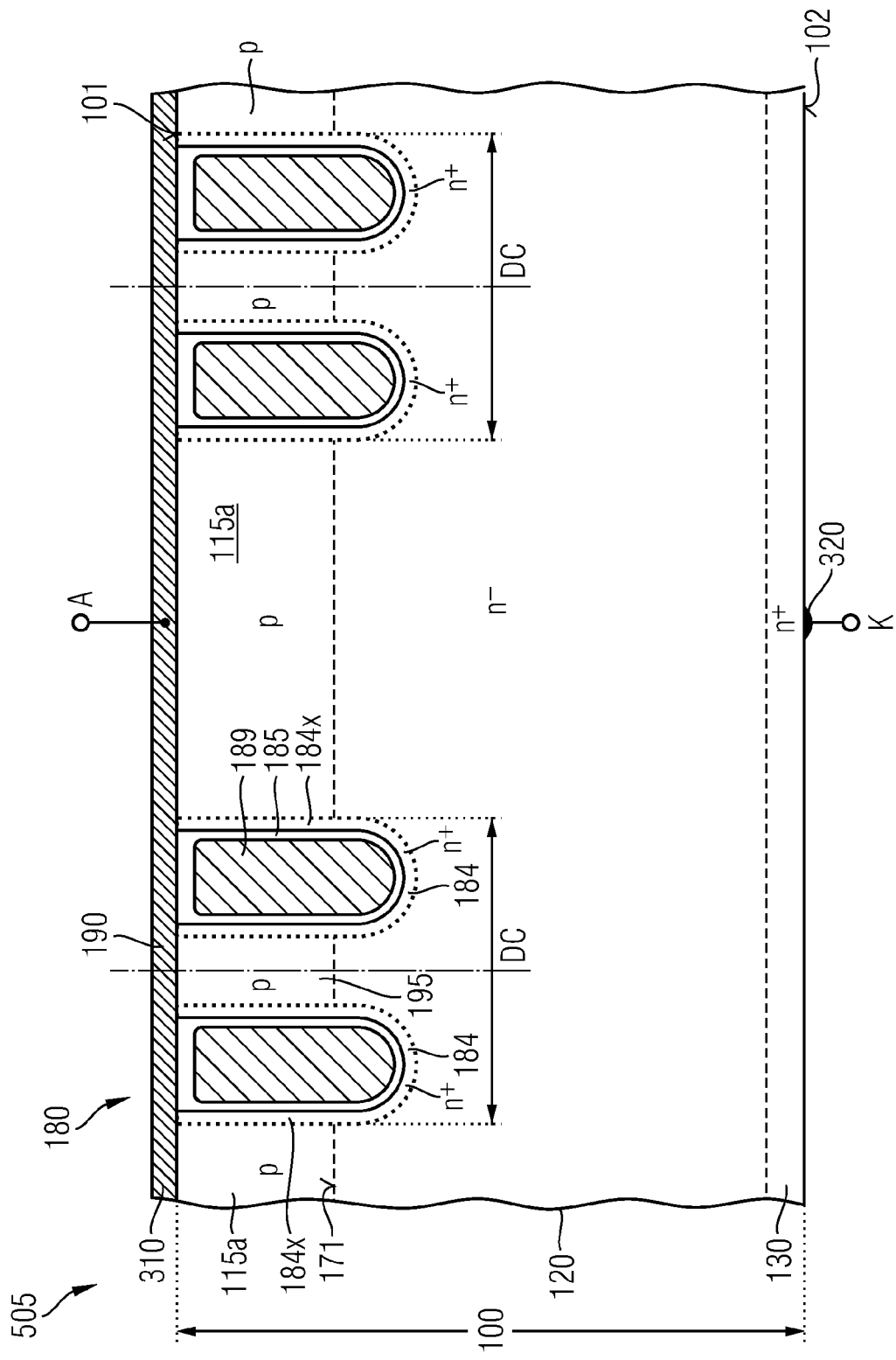
FIG. 2E is a schematic cross-sectional view of a portion of a semiconductor device in accordance with an embodiment related to a semiconductor diode with desaturation cells using a load electrode.

The semiconductor diode 505 in FIG. 2E discharges the electrons of the charge carrier plasma directly to the first load electrode 310 thereby reducing the plasma density in front of the anode regions 115*a*. A forward voltage drop increases at low forward currents indicating a lower density of free charges in front of the anode region 115*a* and a low emitter efficiency. The forward voltage drop decreases for high forward currents because of a high level of free charge carriers and a high emitter efficiency. The semiconductor diode 505 shows an inverted injection dependency of emitter efficiency with low efficiency at low forward currents and high efficiency at high forward currents, whereas conventional p-doping controlled diodes show a strong decay of the emitter efficiency with increasing forward current due to more recombination in the anode region 115*a*. In the blocking mode, the access channels 184 may be fully depleted.

Figure 2F:
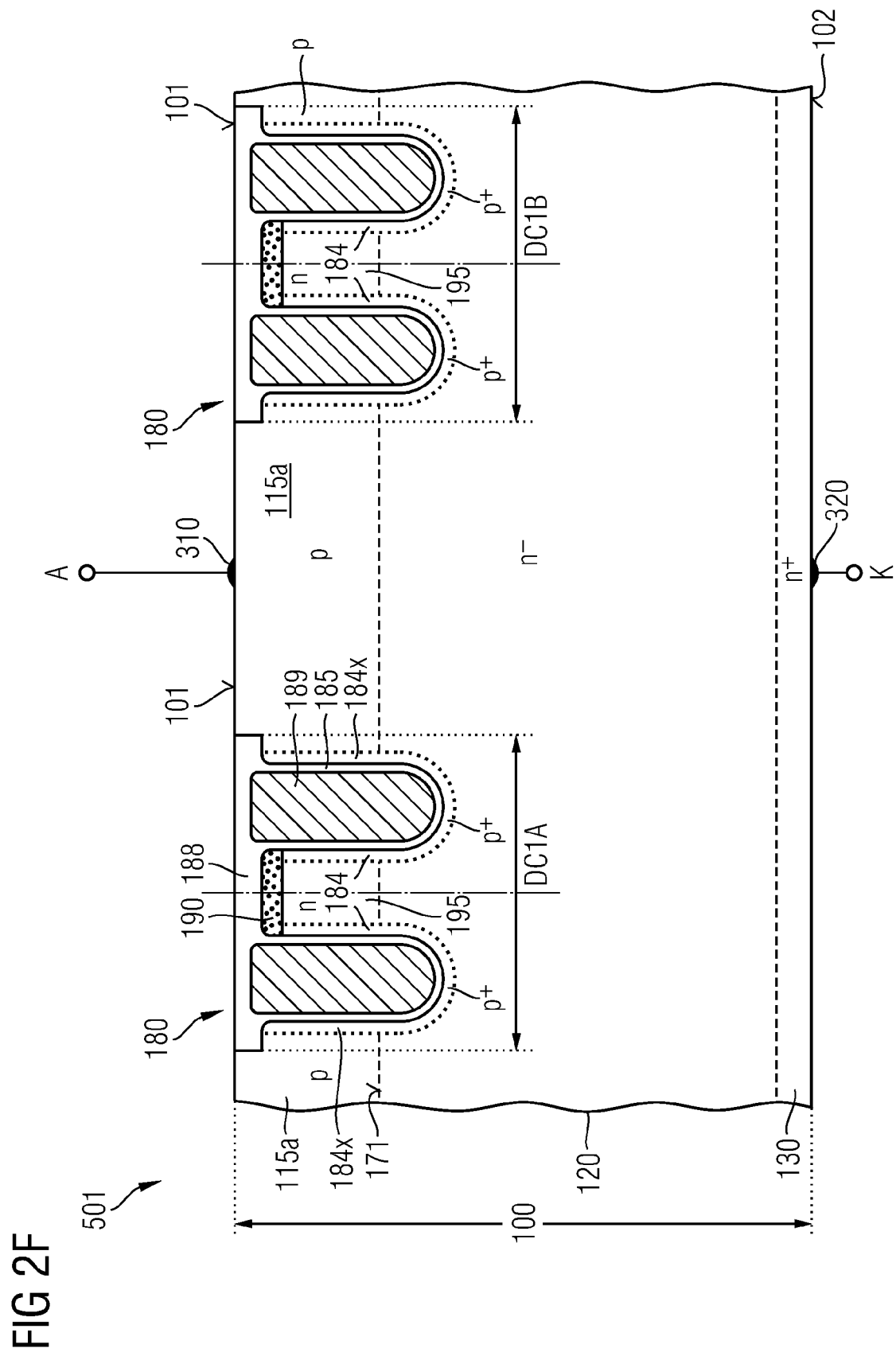
FIG. 2F is a schematic cross-sectional view of a portion of a semiconductor device in accordance with a further embodiment related to a semiconductor diode with desaturation cells at a front side.

FIG. 2F illustrates an embodiment with the separation region 195 having the conductivity type of the drift zone 120. In this case, the access channels 184 are hole channels, e.g., p-doped zones along the parting structures 180 or inversion channels formed by an electric field generated by the parting structures 180.

The semiconductor device illustrated in FIG. 3A is a vertical IGFET 511 with transistor cells TC that include gate electrodes 150 arranged in trench structures extending from the first surface 101 into the semiconductor body 100. The trench structures may or may not include field electrodes 160 between the gate electrodes 150 and the second surface 102, wherein field dielectrics 202 insulate the field electrodes 160 from the gate electrodes 150 and the semiconductor body 100. The field electrodes 160 may float or may be electrically connected to a field electrode potential, which may be a source potential applied to a source electrode.

The semiconductor body 100 includes source regions 110 of a first conductivity type that directly adjoin the first surface 101. Body regions 115*b*, which are effective as the charge-carrier transfer region 115 of the semiconductor device of FIGS. 1A to 1C, separate the source regions 110 from the drift zone 120. Contact structures 305 extend through openings in a dielectric structure 220 into the semiconductor body 100 to electrically connect the first load electrode 310 to both the source regions 110 and the body regions 115*b*.

The first load electrode 310 may be or may be electrically coupled or connected to a source terminal S of the semiconductor device 500. A second load electrode 320 may be or may be electrically connected to a drain terminal D. The gate electrodes 150 of the transistor cells TC are electrically connected to each other and may be electrically connected or coupled to a gate terminal G.

Desaturation cells DC as described with reference to FIG. 2A may be interspersed among the transistor cells TC within an active area 610 of the semiconductor device 500. According to other embodiments, the desaturation cells DC are formed mainly or exclusively along a transition region 650 between the active area 610 and an edge area 690 which is devoid of any transistor cells and which directly adjoins an outer surface of the semiconductor body 100 connecting the first and second surfaces 101, 102.

According to an embodiment, the desaturation cells DC may include connection regions 182 of the first conductivity type structurally connecting the recombination regions 190 and the access channels 184. The connection regions 182 may correspond to the source regions 110 as regards shape and impurity dose. The recombination regions 190 may be formed along protrusions 221 of the dielectric structure 220 extending into the semiconductor body 100 and resulting from filling grooves, which may be formed together with contact trenches for the contact structures 305, with the material of the dielectric structure 220. The protrusions 221 may extend into the separation regions 195 and may have the same depth as the grooves for the contact structures 305. According to other embodiments, the protrusions 221 may extend deeper into the semiconductor body 100 than the contact structures 305 or the mesas with the recombination regions 190 are less high than the mesas with the source regions 110 such that the recombination regions 190 are closer to the drift zone 120 than the contact structures 305.

The desaturation cells DC reduce the plasma density generated in the drift zone 120 in the on state of the transistor cells TC and improve the switching characteristics of the IGFET 511. A trade-off between static and dynamic losses can be improved and tailored to application requirements.

A charge flow through the access channels 184 of the desaturation cells DC may saturate at a drain current through the drift zone 120 below, at or beyond a maximum pulsed load current specified in the datasheet of the concerned IGFET 511 such that the relative desaturation efficiency can be tailored for different application requirements as described in detail with reference to FIG. 2A. For IGFETs the maximum pulsed load current is the pulsed drain current $I_{D,puls}$.

Figure 3B:
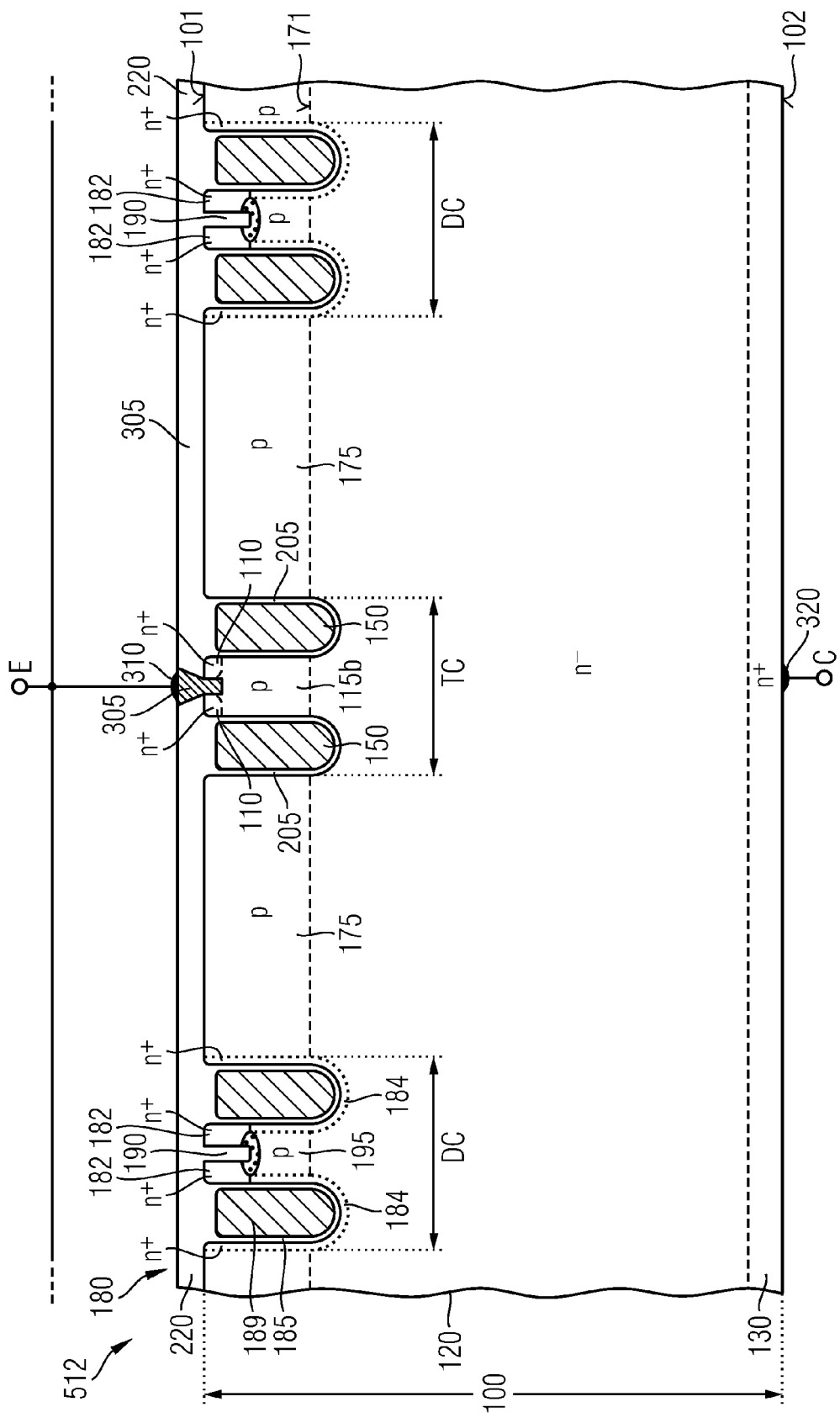
FIG. 3B is a schematic cross-sectional view of a portion of a semiconductor device in accordance with an embodiment related to an IGBT.

In FIG. 3B the illustrated semiconductor device is an IGBT 512 with body zones 115b of transistor cells TC being effective as charge-carrier transfer regions 115 in the sense of FIGS. 1A to 1C. A first load electrode 310, which may be electrically connected to both the source regions 110 and the body regions 115b, may form or may be electrically coupled or connected to an emitter terminal E. The pedestal layer 130 is of a conductivity type opposite to that of the drift zone 120, for example p-type in the case of the illustrated n-channel IGBT. A second load electrode 320 directly adjoining the pedestal layer 130 may form or may be electrically connected to a collector terminal C. Gate electrodes 150 of the transistor cells TC and gate dielectrics 205 dielectrically insulating the gate electrodes 150 from the semiconductor body 100 may be arranged in trenches extending from the first surface 101 into the semiconductor body 100 at least down to the pn junction 171. The gate electrodes 150 may be electrically connected to each other and may be electrically coupled or connected to a gate terminal G.

The body regions 115b may be stripes extending along a lateral direction. For each transistor cell TC at least one gate electrode 150 extends on one lateral side of the body region 115b. In the illustrated embodiment gate electrodes 150 are arranged on opposing sides of the body region 115b. Other embodiments may provide transistor cells with rotational symmetric lateral cross-sectional areas, wherein the cross-sectional areas may be polygons, for example hexagons or squares with or without rounded corners, or circle or a ellipses.

The IGBT 512 includes desaturation cells DC as described above. The cross-sectional areas of the desaturation cells DC and the transistor cells TC may have the same cross-sectional shape. According to a further embodiment, the desaturation and transistor cells DC, TC have the same cross-sectional shape and area. Idle regions 175 may be formed between the desaturation cells DC and the transistor cells TC. The idle regions 175 may have the conductivity type of the separation and body regions 181, 115b.

A dielectric structure 220 may directly adjoin the first surface 101 and may insulate the recombination regions 190 from the first load electrode 310 and/or other metal structures disposed on a surface of the dielectric structure 220 opposite to the semiconductor body 100. The dielectric structure 220 may insulate the idle regions 175 from conductive structures disposed at the side of the first surface 101.

The desaturation cells DC reduce the plasma density generated in the drift zone 120 in the on state of the transistor cells TC and improve the switching characteristics of the IGBT 512 analogously to the IGFET of FIG. 3A.

A charge flow through the access channels 184 of the desaturation cells DC may saturate at a collector current through the drift zone 120 below, at or beyond a maximum pulsed load current specified in the datasheet of the concerned IGBT 512 such that the relative desaturation efficiency can be tailored for different application requirements as described in detail with reference to FIG. 2A. For IGBTs the maximum pulsed load current is the pulsed collector current $I_{C,puls}$.

Figure 3C:
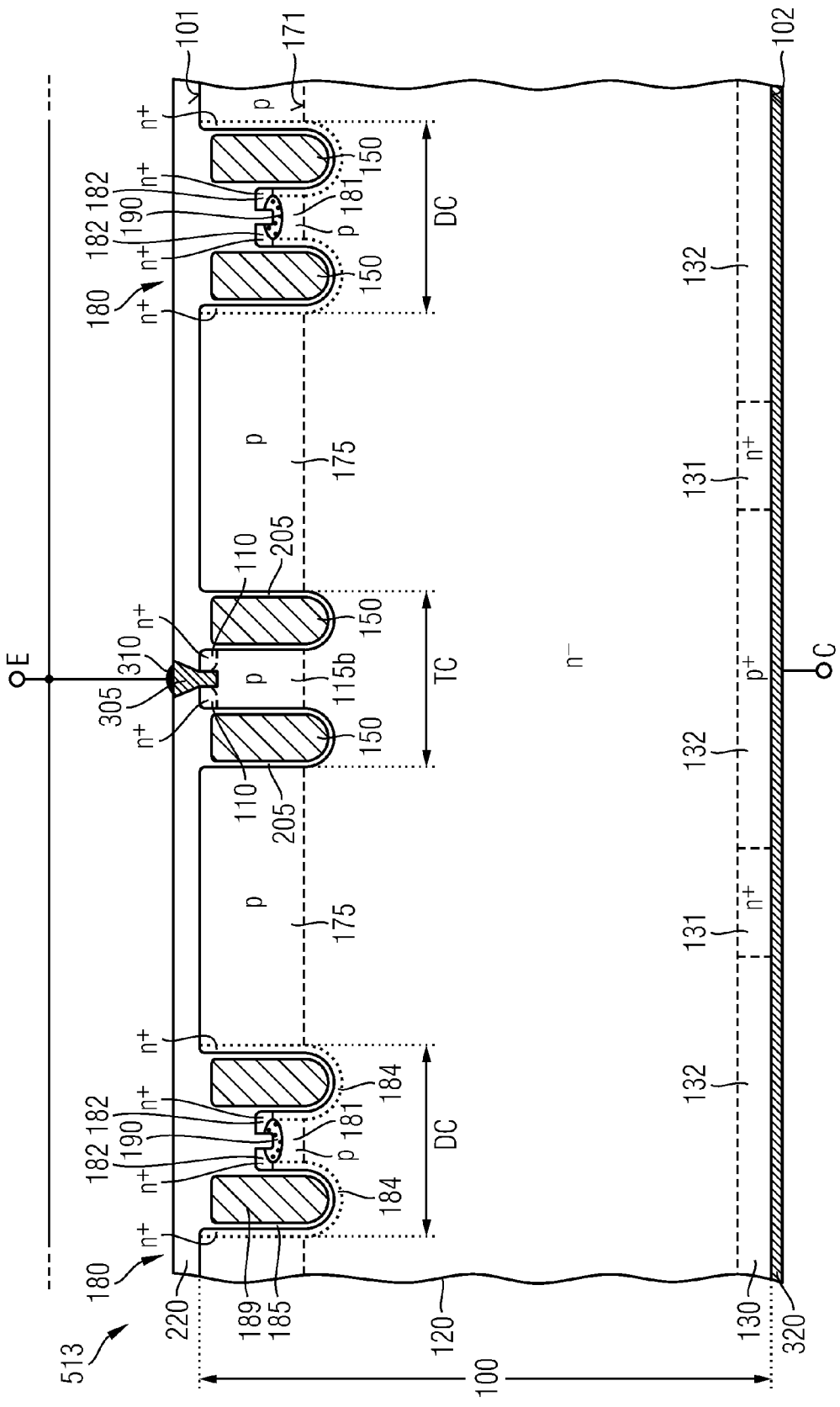
FIG. 3C is a schematic cross-sectional view of a portion of a semiconductor device in accordance with an embodiment related to an RC-IGBT (reverse-conducting IGBT).

FIG. 3C refers to an RC-IGBT 513 with the pedestal layer 130 including first zones 131 of the first conductivity type and second zones 132 of the second conductivity type. The second load electrode 320 directly adjoins both the first and the second zones 131, 132. No, some, or all of the idle regions 175 may be electrically connected to the first load electrode 310. For further details, reference is made to the description of the IGBT 512 in FIG. 3B.

The RC-IGBT 513 includes an integrated free-wheeling diode with the first zones 131 of the pedestal layer 130, effective as a cathode region and the body regions 115b as well as, if applicable, idle regions 175 connected to the first load electrode 310, effective as an anode region. The RC-IGBT 513 is in a forward biased mode when the pn junction 171 between the body region 115b and the drift zone 120 is reverse biased and the RC-IGBT conducts a current only when a suitable gate potential is applied to the gate electrode 150. In the reverse biased mode, the integrated free-wheeling diode of the RC-IGBT conducts a current irrespective of a voltage applied at the gate electrodes 150.

In the reverse biased mode of the RC-IGBT 513, the internal pn junction 171 is forward biased and the drift zone 120 is flooded with mobile charge carriers. The charge carriers have to be drained off from the drift zone 120 when the RC-IGBT switches from the reverse biased mode or diode mode to a forward blocking mode. The desaturation cells DC drain off a significant portion of the mobile charge carriers. The connection of the recombination region 190 to the drift zone 120 does not adversely affect the blocking characteristics of the RC-IGBT 513. If the semiconductor device 500 is used as a switch in a half-bridge configuration, short-circuit conditions can be avoided.

A charge flow through the access channels 184 of the desaturation cells DC may saturate at a reverse current through the drift zone 120 below, at or beyond a maximum pulsed load current specified for the reverse diode in the datasheet of the concerned RC-IGBT 513 such that the relative desaturation efficiency can be tailored for different application requirements as described in detail with reference to FIG. 2A. For the reverse diode of RC-IGBTs the maximum pulsed load current is the diode pulsed current $I_{F,puls}$.

FIGS. 4A to 4D refer to the arrangement of desaturation cells DC in semiconductor diodes.

Figure 4A:
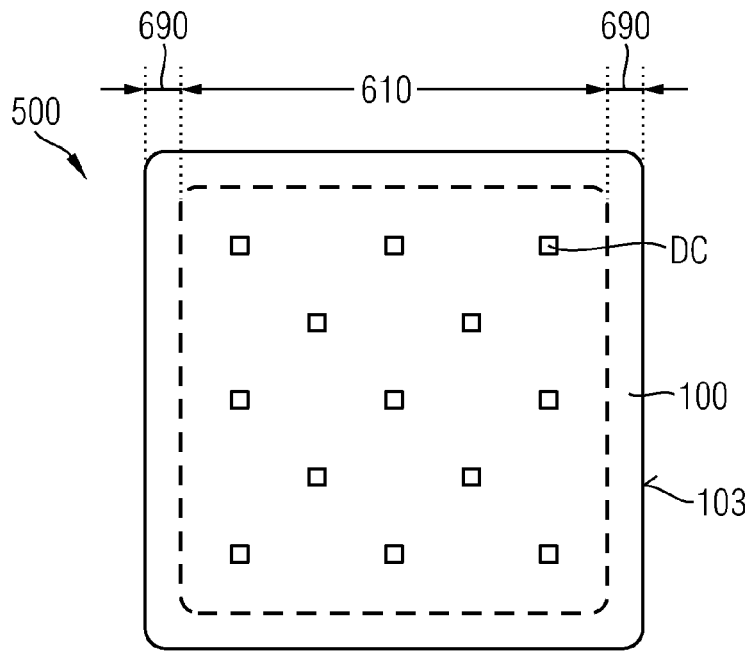
FIG. 4A is a schematic plan view of a semiconductor body of a semiconductor diode according to an embodiment providing evenly distributed compact desaturation cells.

FIG. 4A shows compact desaturation cells DC with both lateral dimensions being significantly smaller than the corresponding lateral dimensions of an active area 610 of a semiconductor body 100 of the semiconductor device 500. The semiconductor body 100 includes an active area 610 and an edge area 690 between the active area 610 and an outer surface 103 of the semiconductor body 100. The edge area 690, which is devoid of any anode region, surrounds the active area 610, which includes the anode region(s).

The compact desaturation cells DC may be arranged in regularly spaced lines and columns oriented along the edges or along the diagonals of the rectangular semiconductor body 100. The desaturation cells DC may be approximately identical. A population density of the desaturation cells DC may be homogenous across the whole active area 610, wherein the desaturation cells DC may have identical access channels

184. According to an embodiment, a charge carrier current in the desaturation cells DC may increase with decreasing distance to the edge area. For example, the desaturation cells DC may have different widths. For example, the access channels 184 of desaturation cells DC closer to the edge area 690 may be wider than the access channels 184 of desaturation cells DC more distant to the edge area 690.

According to other embodiments, the population density of the desaturation cells DC may be lower in a central portion of the active area 610 and may be denser in an outer portion of the active area 610 adjoining the edge area 690 in order to increase dynamic ruggedness and to improve the temperature distribution in the semiconductor device.

Figure 4B:
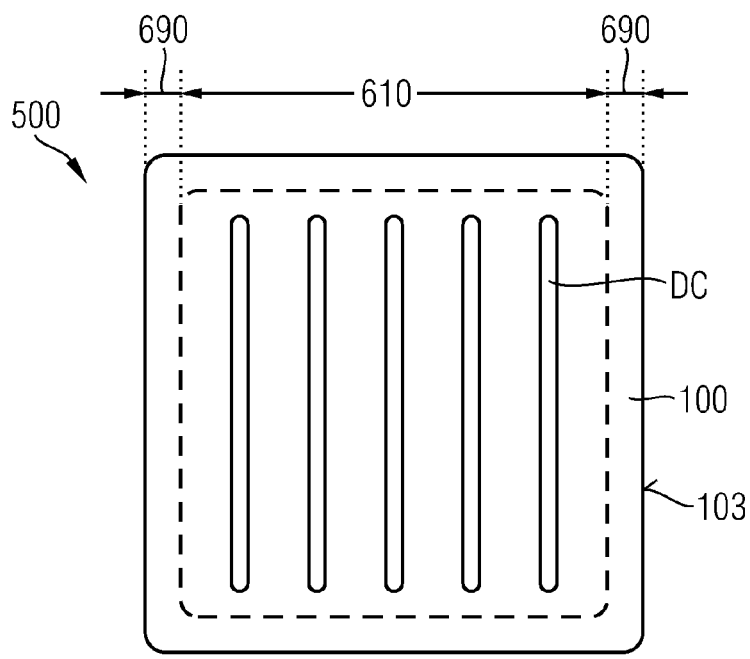
FIG. 4B is a schematic plan view of a semiconductor body of a semiconductor diode according to an embodiment providing stripe-shaped desaturation cells.

FIG. 4B shows stripe-shaped desaturation cells DC arranged at a regular center-to-center distance (pitch) and oriented along one of the outer edges of the semiconductor body 100.

Figure 4C:
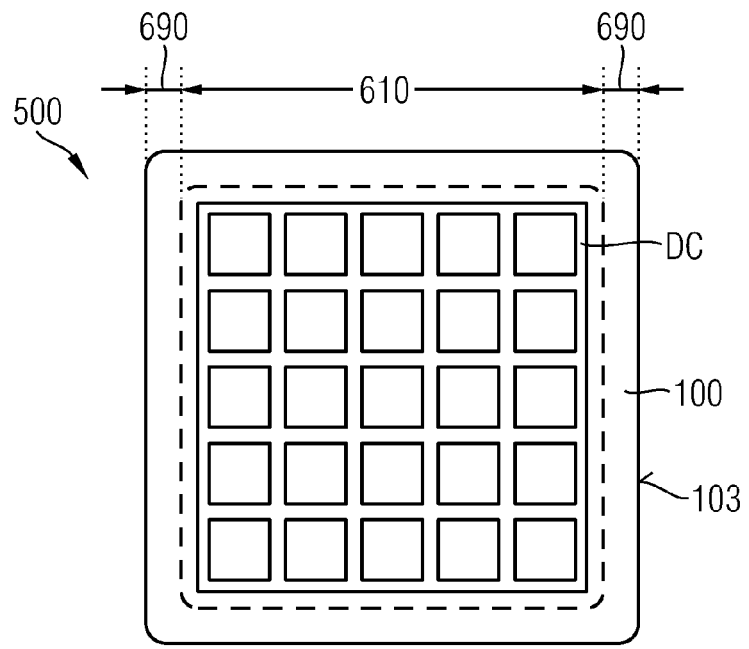
FIG. 4C is a schematic plan view of a semiconductor body of a semiconductor diode according to an embodiment providing a grid-like desaturation cells.

FIG. 4C shows a grid-shaped cell DC with a plurality of sub-portions of the anode region 115b formed in the meshes. The size of the meshes may be homogenous across the whole active area 610 or may decrease with decreasing distance to the edge area 690.

Figure 4D:
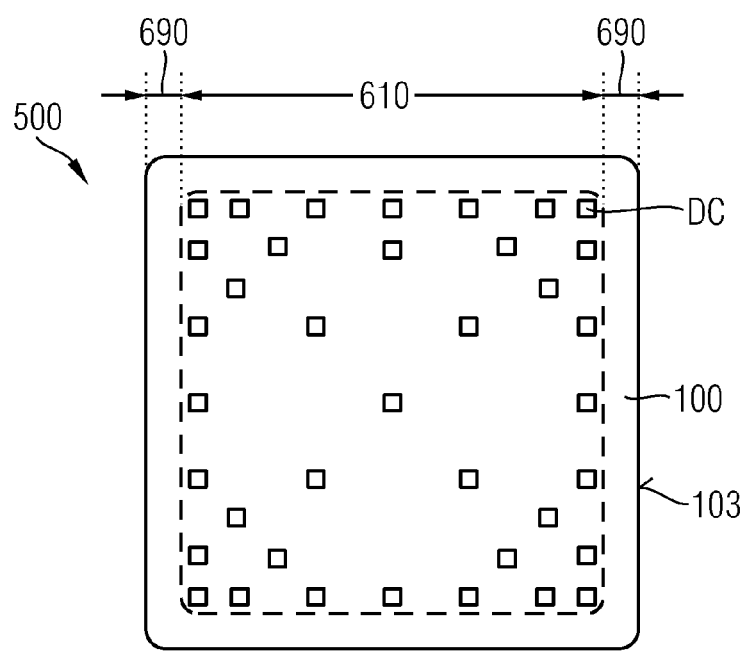
FIG. 4D is a schematic plan view of a semiconductor body of a semiconductor diode according to an embodiment providing unevenly distributed compact desaturation cells.

In FIG. 4D compact desaturation cells DC are arranged at a lower population density in a central portion of the active area 610 and at a higher population density in portions of the active area 610 oriented to the edge area 690.

FIGS. 5A to 5D refer to the arrangement of transistor cells TC and desaturation cells DC for IGFETs and IGBTs including RC-IGBTs.

Figure 5A:
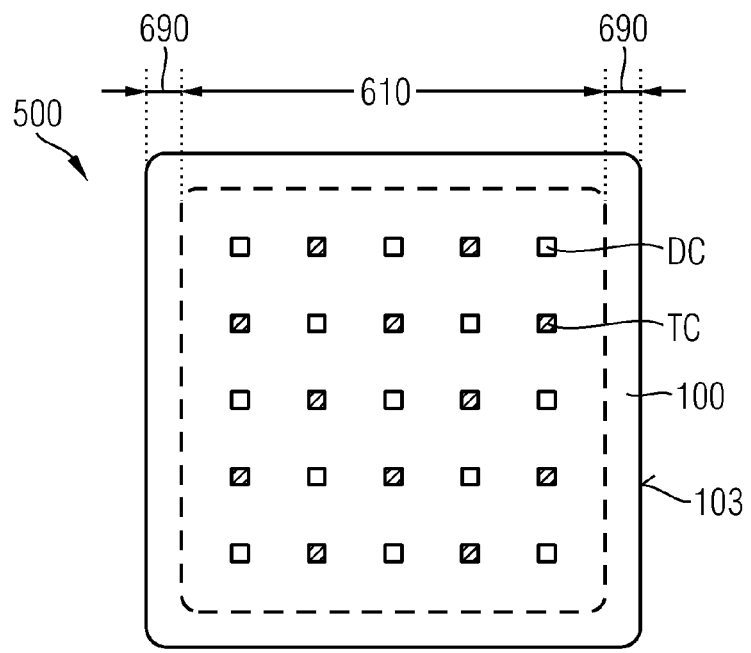
FIG. 5A is a schematic plan view of a semiconductor body of a semiconductor device including evenly distributed compact desaturation and transistor cells.

FIG. 5A refers to an arrangement of transistor cells TC and desaturation cells DC in a regular, matrix-like pattern in equally spaced lines and columns. Along each line and along each column the desaturation and transistor cells DC, TC may be alternatingly arranged. Apart from the outermost desaturation and transistor cells DC, TC, each transistor cell TC may adjoin four desaturation cells DC and vice versa. The arrangement may be similar to a checker board pattern with transistor cells TC assigned to the white fields and the desaturation cells DC assigned to the black fields. According to other embodiments, the outermost lines and columns adjoining the edge area 690 may include more desaturation cells DC than transistor cells TC to support the desaturation of the edge area 690.

Figure 5B:
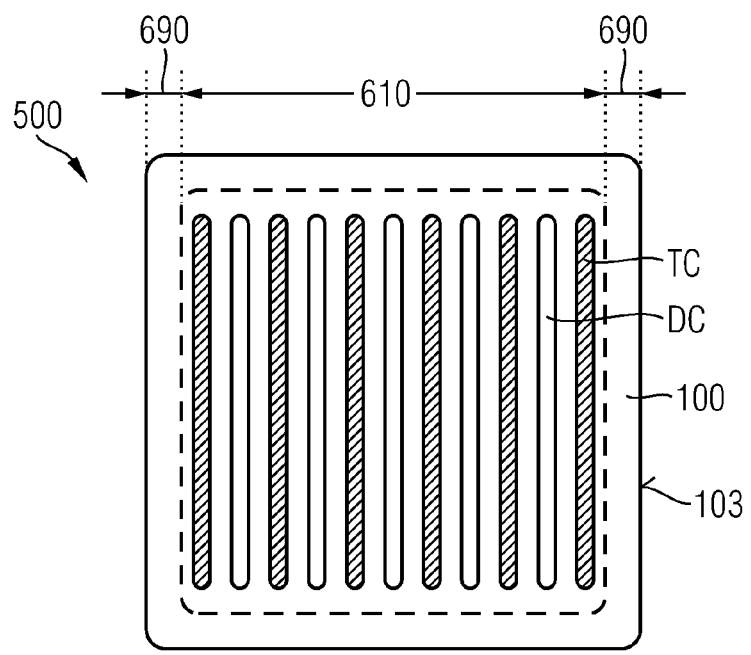
FIG. 5B is a schematic plan view of a semiconductor body of a semiconductor device including regularly arranged transistor and desaturation cells.

FIG. 5B refers to stripe-shaped transistor and desaturation cells TC, DC, which may extend parallel to one of the edges of the semiconductor body 100 and which may be arranged at regular pitches.

FIG. 5C shows a desaturation cell DC forming a grid with the transistor cells TC arranged in the meshes. Another embodiment may provide the inverted pattern with a transistor cell forming the grid and the desaturation cells formed in the meshes of the grid.

FIG. 5D shows regularly arranged compact transistor cells TC in a central portion of the active area 610 and a frame-like desaturation cell DC arranged in an outer portion 619 of the active area 610 oriented to the edge area 690.

Manufacturing a semiconductor device of the embodiments of FIGS. 2B and 2C includes forming a drift zone and a charge-carrier transfer region in a semiconductor substrate, wherein the drift zone and the charge-carrier transfer region form a pn junction. A recombination region and a separation region between the recombination region and the drift zone are formed. An access channel is formed that provides a permanent charge carrier path that connects the recombination region and the separation region. Desaturation cells comprising the recombination regions and access channels may be formed at a front and/or rear side of the semiconductor substrate.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a pn junction formed between a drift zone and a charge-carrier transfer region in a semiconductor body;
a recombination region; and
an access channel configured to form a permanent charge carrier path connecting the recombination region with the drift zone through a separation region between the recombination region and the drift zone.

2. The semiconductor device of claim 1, wherein
a surface recombination velocity of the recombination structure is at least 0.5% of the saturation velocity of charge carriers in the semiconductor body.

3. The semiconductor device of claim 1, wherein
a surface recombination velocity of the recombination structure is at least $5 \times 10^4$ cm/s.

4. The semiconductor device of claim 1, further comprising:
a parting structure extending from a surface of the semiconductor body through the separation region down to at least the drift zone and directly adjoining the access channel.

5. The semiconductor device of claim 4, wherein:
the separation region has a conductivity type complementary to a conductivity type of the drift zone:
the access channel has the conductivity type of the drift zone; and
the parting structure extends from a first surface into the drift zone.

6. The semiconductor device of claim 4, wherein:
the separation region has a conductivity type of the drift zone;
the access channel has a conductivity type opposite to a conductivity type of the drift zone; and
the parting structure extends from a second surface into the drift zone.

7. The semiconductor device of claim 4, wherein:
a first separation region has a conductivity type complementary to a conductivity type of the drift zone;
a first access channel has the conductivity type of the drift zone;
a first parting structure extends from a first surface into the drift zone;
a second separation region has a conductivity type of the drift zone;
a second access channel has a conductivity type opposite to a conductivity type of the drift zone; and
a second parting structure extends from a second surface into the drift zone.

8. The semiconductor device of claim 4, wherein
the parting structure consists of dielectric and/or intrinsic semiconductor materials.

9. The semiconductor device of claim 4, wherein
the parting structure comprises conductive material dielectrically insulated from electrodes of the semiconductor device.

10. The semiconductor device of claim 4, wherein
the parting structure comprises conductive material electrically connected to an electrode of the semiconductor device.

11. The semiconductor device of claim 1, wherein
the access channel has a conductivity type opposite to a conductivity type of the separation region.

12. The semiconductor device of claim 4, wherein:
the access channel has a conductivity type of the separation region; and
stationary charges in the parting structure induce an electric field accumulating free charge carriers of a charge carrier type corresponding to the conductive type opposite to the conductivity type of the charge carrier transfer region along the parting structure.

13. The semiconductor device of claim 1, wherein
the access channel is configured such that a charge flow through the access channel saturates at a load current through the drift zone the above a maximum pulsed load current.

14. The semiconductor device of claim 1, wherein
the access channel is configured such that a charge flow through the access channel saturates at a load current through the drift zone below a maximum pulsed load current.

15. The semiconductor device of claim 1, wherein:
access channels of first desaturation cells are configured such that a charge flow through the access channels saturates at a load current through the drift zone above a maximum pulsed load current; and
access channels of second desaturation cells are configured such that a charge flow through the access channel saturates at a load current through the drift zone below the maximum pulsed load current.

16. The semiconductor device of claim 1, wherein
the recombination region contains metal atoms.

17. The semiconductor device of claim 1, wherein
the access channel contains deep level donors.

18. The semiconductor device of claim 1, wherein:
the access channel and the recombination region form a desaturation cell and the semiconductor device further comprises a plurality of desaturation cells arranged in an active area; and
a charge carrier current in the desaturation cells increases with decreasing distance to an edge area surrounding an active area and being devoid of desaturation cells.

19. The semiconductor device of claim 1, wherein:
the semiconductor device is a diode; and
the charge-carrier transfer region is electrically connected to a load electrode.

20. The semiconductor device of claim 1, further comprising:
field effect transistor cells including source regions electrically connected to a load electrode; and
wherein the charge-carrier transfer region comprises body regions separating the source regions from the drift zone.

* * * * *